United States Patent
Betker et al.

[11] Patent Number: 6,000,957
[45] Date of Patent: Dec. 14, 1999

[54] PC CARD EXTENDABLE INTERFACE

[75] Inventors: Jay Brian Betker, Yorba Linda; Charles Linsday Bates, III, Laguna Hills, both of Calif.

[73] Assignee: ITT Manufacturing Enterprises, Inc., Wilmington, Del.

[21] Appl. No.: 08/999,079

[22] Filed: Dec. 29, 1997

[51] Int. Cl.[6] .................................................. H01R 13/44
[52] U.S. Cl. ...................................... 439/131; 439/946.2
[58] Field of Search ..................................... 439/131, 676, 439/946

[56] References Cited

U.S. PATENT DOCUMENTS

| | | | |
|---|---|---|---|
| 4,915,655 | 4/1990 | Tanaka | 439/676 |
| 5,035,641 | 7/1991 | Van-Santbrink et al. | 439/329 |
| 5,183,404 | 2/1993 | Aldous et al. | 439/55 |
| 5,336,099 | 8/1994 | Aldous et al. | 439/131 |
| 5,338,210 | 8/1994 | Beckham et al. | 439/131 |
| 5,391,083 | 2/1995 | Roebuck et al. | 439/76 |
| 5,391,094 | 2/1995 | Kakinoki et al. | 439/638 |
| 5,395,268 | 3/1995 | Okada | 439/676 |
| 5,411,405 | 5/1995 | McDaniels et al. | 439/131 |
| 5,463,261 | 10/1995 | Skarda et al. | 307/131 |
| 5,477,418 | 12/1995 | MacGregor et al. | 361/737 |
| 5,499,923 | 3/1996 | Archibald et al. | 439/26 |
| 5,505,633 | 4/1996 | Broadbent | 439/329 |
| 5,509,811 | 4/1996 | Homic | 439/55 |
| 5,538,442 | 7/1996 | Okada | 439/676 |
| 5,547,401 | 8/1996 | Aldous et al. | 439/676 |
| 5,562,463 | 10/1996 | Tan | 439/76.1 |
| 5,562,504 | 10/1996 | Moshayedi | 439/638 |
| 5,608,607 | 3/1997 | Dittmer | 361/686 |
| 5,634,802 | 6/1997 | Kerklaan | 439/131 |
| 5,637,018 | 6/1997 | Gargioul | 439/640 |
| 5,667,395 | 9/1997 | Okada et al. | 439/131 |
| 5,679,013 | 10/1997 | Matsunaga et al. | 439/144 |
| 5,692,914 | 12/1997 | Mitani et al. | 439/131 |
| 5,754,404 | 5/1998 | Biermann et al. | 439/946 |
| 5,773,332 | 6/1998 | Glad | 439/946 |
| 5,775,951 | 7/1998 | Gargiulo | 439/946 |

*Primary Examiner*—Renee S. Luebke
*Assistant Examiner*—Hae Moon Hyeon
*Attorney, Agent, or Firm*—Thomas L. Peterson

[57] ABSTRACT

A PC card of limited height (5 or 10 mm) is constructed with an extendable connector at its rear end for connection to a tall plug such as an RJ (telephone-type) plug that is designed to fit into a receptacle of large height. The connector apparatus is formed by a plastic molded rear end cap (22) at the rear of the PC card, with the cap having a slot (102) and with an adaptor platform (52) being slidable in the slot between an extended position wherein a rear portion of the platform projects a plurality of millimeters rearward of the end cap, and a stored position wherein the platform rear end is about flush with the cap rear surface. A hold-down (54) is pivotally mounted on the platform, the hold-down being pivoted down into a platform recess in the stored position and being pivoted up above the top of the PC card (10) to form a receptacle for receiving the plug in the deployed position. The slot in the cap has cap slot walls extending 360° around the slot axis (104), to provide a rugged support for the platform. The hold-down has a middle portion that lies uppermost when receiving a plug, with the middle portion lying forward of the hold-down pivot axis in the stored position of the platform, and with the middle portion forming a handle (100) to help pull out the platform.

15 Claims, 6 Drawing Sheets

PC CARD EXTENDABLE INTERFACE

BACKGROUND OF THE INVENTION

PC cards are becoming widely used to provide an interface between circuitry in an electronic device such as a portable computer, and other devices such as modems, facsimile machines, sound and video equipment, etc. PC cards complying with PCMCIA standards (Personal Computer Memory Card International Association) have a width and length about the same as a common credit card, of 54 mm×85.6 mm. The maximum thickness of the standard card varies, with Type I card being 3.3 mm, Type II card being 5 mm, and Type III card being 10.5 mm. There is a need for a very low cost interface between a PCMCIA card and RJ style plugs.

RJ plugs are commonly used to connect household and business telephones to cables. Such RJ, or telephone-type plugs are designed for insertion into recesses having a height of about 10 mm, with the bottom walls of the recess holding contacts for engaging the plug contacts so the receptacle must have a total height of at least about 14 mm. As a result, a simple slot cannot be provided at the rear end of a standard PC card to receive and connect to such a plug. In many electronic devices that receive PC cards, a door is provided that closes the rear end of the card-receiving slot. Accordingly, the PC card that can connect to an RJ plug, must not be thicker or longer than the given card dimensions when not connected to an RJ plug.

One solution to the connection of an RJ plug to a PC card is to provide a removable adaptor with a tall cavity at the rear for receiving the RJ plug and with a narrow plug at its front end for insertion into the rear of the PC card. However, there is a danger that such a removable adaptor will be lost. Also, such an adaptor adds to the cost of the interface. Apparatus that could be substantially completely contained within the dimensions of a standard PC card such as a Type II type (which is the most popular type), but which could be extended for mating with an RJ plug, which was rugged and facilitated rearward pullout of the device, would be of value.

SUMMARY OF THE INVENTION

In accordance with one embodiment of the invention, a rugged and easily used PC card and apparatus for incorporation into the rear of a PC card are provided, which enable connection of the rear of the PC card to a plug that is taller than the card, while allowing the card to fit completely into a thin slot of limited length in an electronic device. The PC card includes a rear end cap with a slot extending in forward and rearward directions therein. An adaptor includes a platform with contacts, that can move within the slot between a stored position wherein substantially the entire adaptor lies within the PC card and an extended position. In the extended position, a rear portion of the platform projects rearwardly from the rest of the PC card, and a hold-down holds down a tall plug to the platform contacts. The holdown is a wire bail that is pivotally mounted on the platform to pivot from a stowed position wherein it lies in a platform recess, and a deployed position wherein a middle portion of the bail lies high above the platform to hold down the plug. In the stowed position, a part of the middle portion of the bail lies at the rear of the PC card where it can be grasped to rearwardly pull out the platform. The slot in the cap forms slot walls that extend 360° around the axis of the slot and forwardly by a plurality of times the average height of the slot, for secure and rugged holding of the adaptor even in its extended position. The platform can extend rearwardly from the rear end cap by no more than 10 mm, to allow the RJ plug to overhang the platform.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
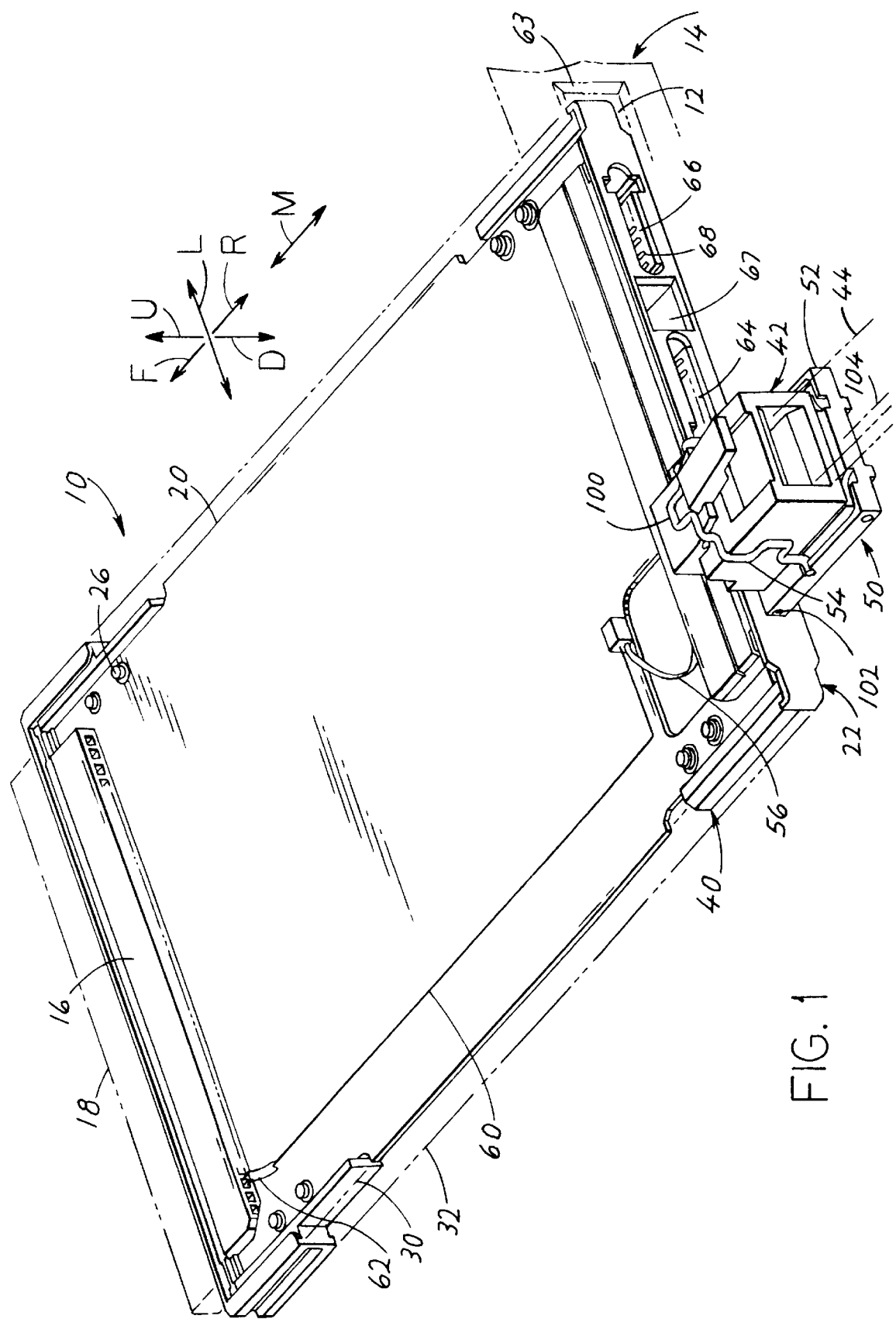
FIG. 1 is an isometric view of a PC card of the present invention, with the cover set shown in phantom lines and with an RJ plug shown fully installed on an adaptor.

FIG. 1 illustrates a PC card 10 which is a Type II card, lying in a slot 12 of an electronic device 14. A front electrical connector 16 of the card is connected to circuitry 18 in the electronic device, with only a mating connector being shown at 18. A circuit board 20 extends between the front connector 16 and a rear end cap 22. The board extends between the front connector and the rear end cap and is fixed to them by posts 26. Upper and lower sheet metal covers 30, 32 also extend between the front connector and rear cap, and enclose the circuit board and any components thereon. The combination of the front connector 16, the rear end cap 22, and the sheet metal cover set 30, 32 can be considered to be a support structure 40.

FIG. 1 shows a telephone-type plug 42, generally referred to as an RJ plug that is commonly connected to the ends of telephone and other telecommunications cables such as cable 44. The PC card includes an adaptor 50 that is designed to connect to the plug 42. The adaptor includes a platform 52 and a holdown 54 in the form of a wire bail, with the plug inserted between them. A flexible cable 56 connects contacts on the platform to an electronic coupling 60 on the circuit board that connects to contacts 62 of the front connector 16. While the coupling 60 is shown as being a simple trace, the PC card can include signal processing circuitry such as a filter, preamplifier, pulse suppressor, etc. Such circuitry is common for other receptacles 64, 66 that are provided on opposite sides of an undercut strike 67, with the receptacles having pin contacts 68.

As mentioned earlier, a standard PC card has a maximum width in the lateral direction L of 54 mm and a maximum length in the forward and rearward F, R or longitudinal direction M of 85.6 mm. The Type II card has a thickness in the up and down directions U, D of slightly less than 5 mm. Some electronic devices have doors that close over the tapered entrance 63 of the card-receiving slot 12. Also, many slots 12 surround only the card, so any attachment at the rear of the card will project from the electronic device and be subject to damage. While the card illustrated has a thickness of less than 5 mm, a common RJ plug 42 is designed to fit into a receptacle passage of about 10 mm height in a receptacle of a height of at least about 13 mm. As a result, an adaptor 50 is required which can be moved between the extended position shown in FIG. 1 wherein it projects rearwardly of the electronic device 14 to hold the tall plug 42, and a stored position wherein it does not project rearwardly or above or below the card.

Figure 3:
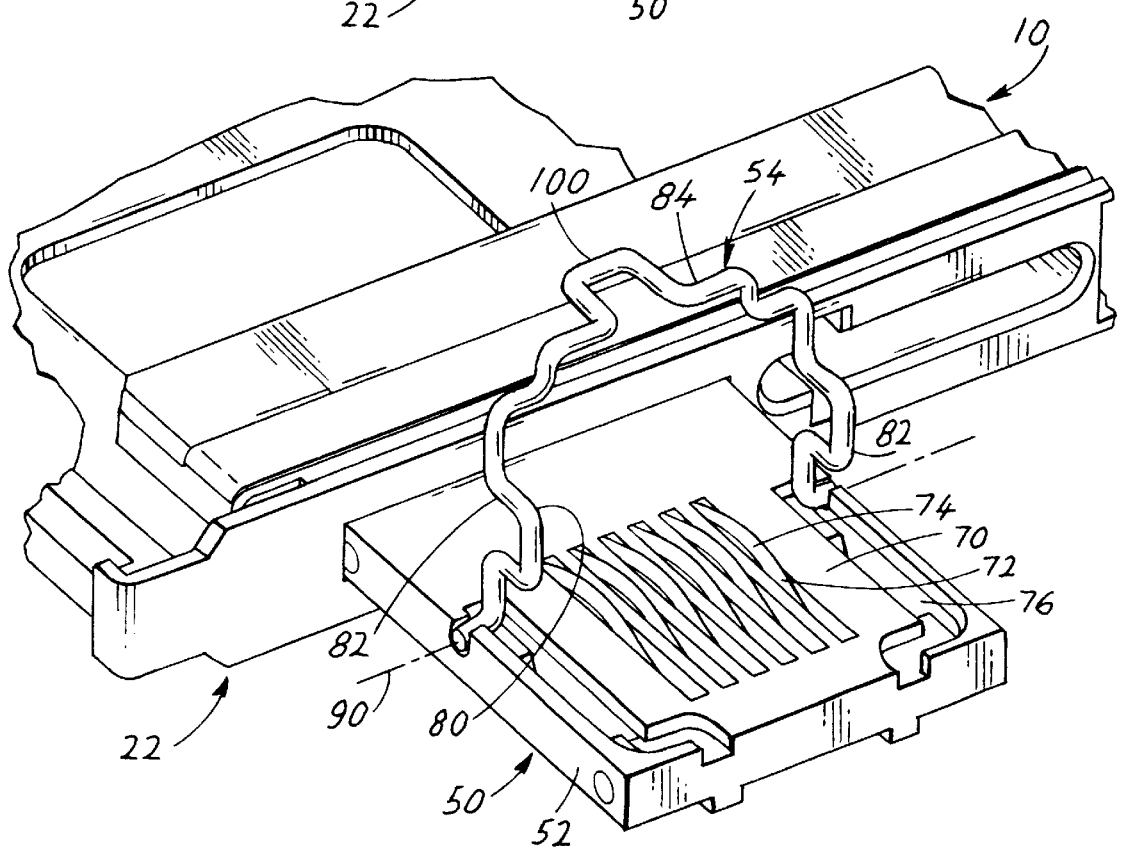
FIG. 3 is an isometric view of a portion of the PC card of FIG. 1, but without the plug installed therein.

FIG. 3 shows the adaptor 50 in its fully extended position. The platform 52 is a molded plastic part, with an upper surface 70 on which the plug will rest. Adaptor contacts 72 have terminal-engaging parts 74 which are shown extending above the platform surface. It is noted that some RJ plugs have terminals that extend below the RJ block lower surface so that the engaging part 74 can lie recessed within grooves in the platform. The platform has recess portions 76 that can receive the hold-down 54, which is shown as being in the form of a wire bail. When the hold-down is in its deployed position, which is shown in FIG. 3, it forms a receptacle 80 between itself and the platform, with the RJ plug being pluggable into the receptacle. Opposite legs or ends 82 of the hold-down locate the plug in the lateral direction L, while the middle 84 presses down the plug to maintain engagement between the plug terminals and the adaptor contacts. The hold-down is pivotable about a pivot axis 90, from the deployed position shown in FIG. 3, to a stowed position wherein most of the hold-down lies in the recess portions 76 of the platform. After the hold-down is pivoted to its stowed position, the platform can be pushed forwardly into the PC card 10 so none of the adaptor extends sufficiently rearward of the rear end cap 22 to prevent a door of an electronic device from closing or to subject the adaptor to damage by appliances that are moved across a position immediately rearward of the entrance to the slot in the electronic device.

Figure 2:
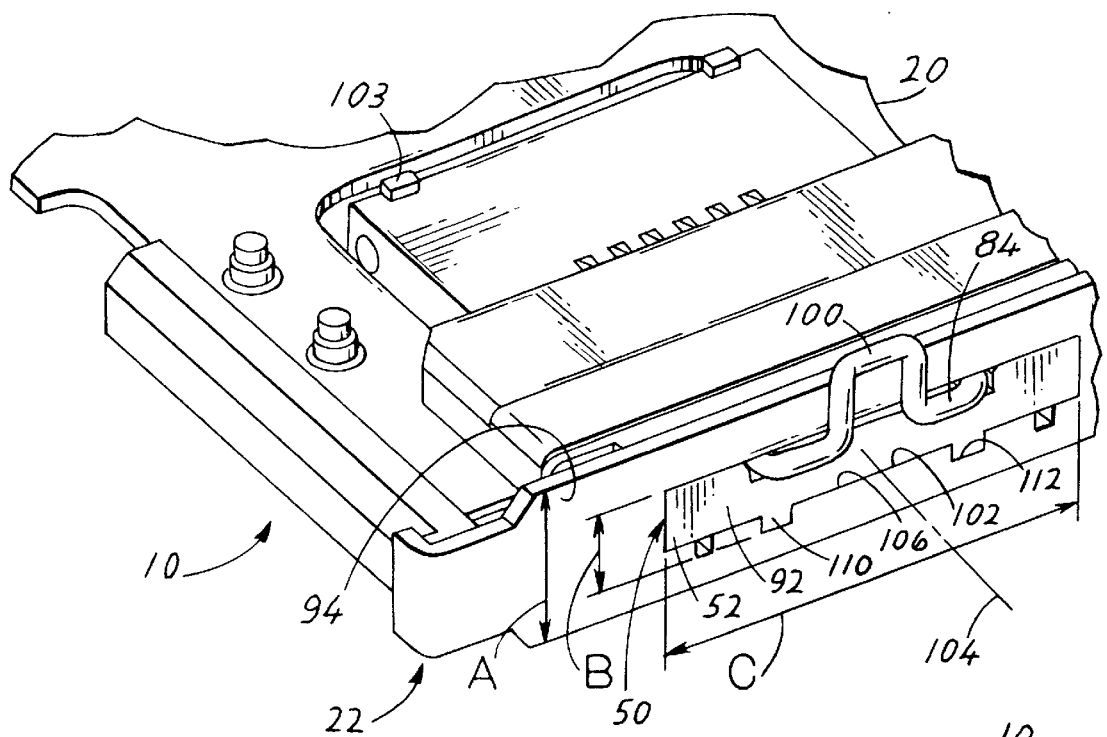
FIG. 2 is a partial isometric view of the PC card of FIG. 1, with the platform in its retracted position and the bail in its stowed position.

FIG. 2 shows the adaptor 50 in its fully stored position, with the rear end 92 of the platform 52 lying largely flush with a rear face 94 of the rear end cap 22. However, a handle part 100 of the hold-down middle 84 lies rearward of the rear end cap, to serve as a handle for rearward pullout of the adaptor. The hold-down is formed of a bent wire having a thickness of no more than about 1 mm, so the handle part 100 extends less than 2 mm rearward of the cap face 94. Applicant prefers to let the handle part 100 project slightly above the top of the end cap to lie in the slightly larger tapered entrance to the slot in the electronic device, to make it easier to grasp the handle part, although this is not necessary. In any case, the wire handle part 100 is easily grasped to pull the adaptor out of the slot 102 in the rear end cap 22, until stops 103 prevent a further pullout.

The rear end cap is constructed to securely hold the platform in the extended platform position. The slot 102 has an axis 104, and the slot walls 106 extend 360° around the axis 104. That is, the slot 102 does not extend vertically between the top and bottom of the end cap 22. Applicant provides a pair of rails 110 that extend along tracks 112 in the slot walls, to accurately guide the platform in its longitudinal movement.

Figure 4:
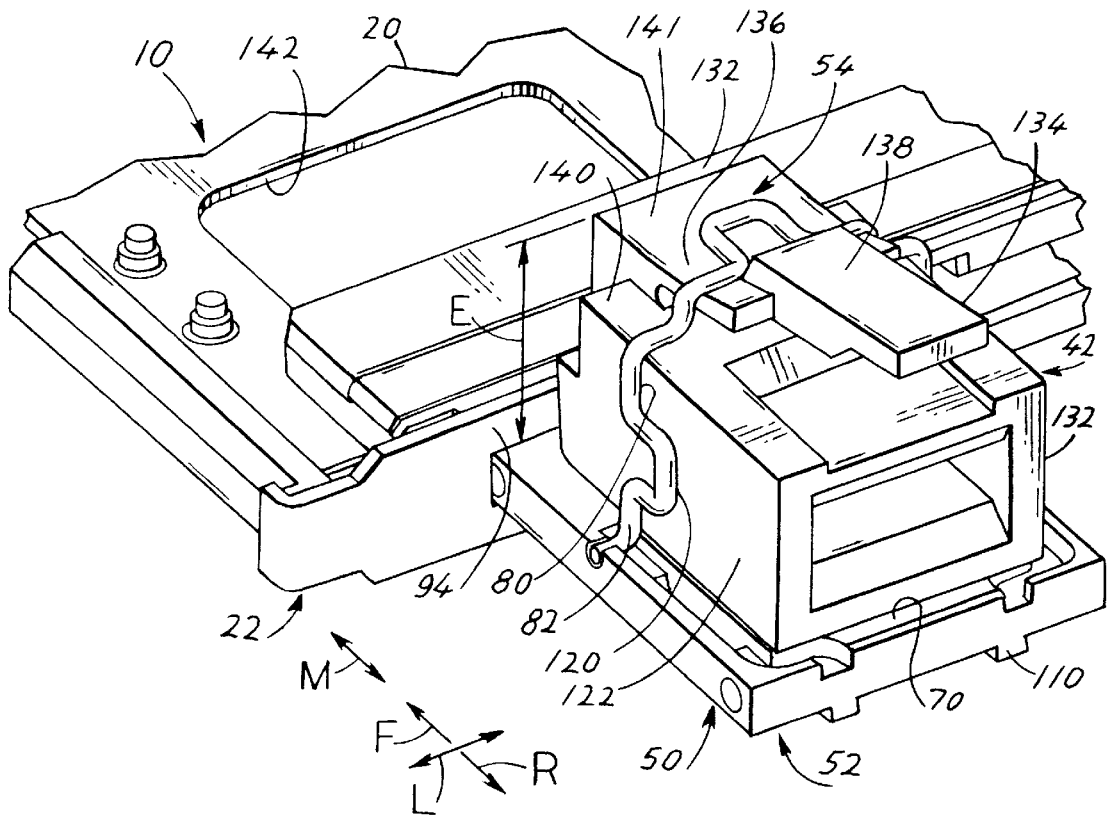
FIG. 4 is an enlarged isometric view of a portion of the PC card of FIG. 1, with the plug installed thereon.
Figure 5:
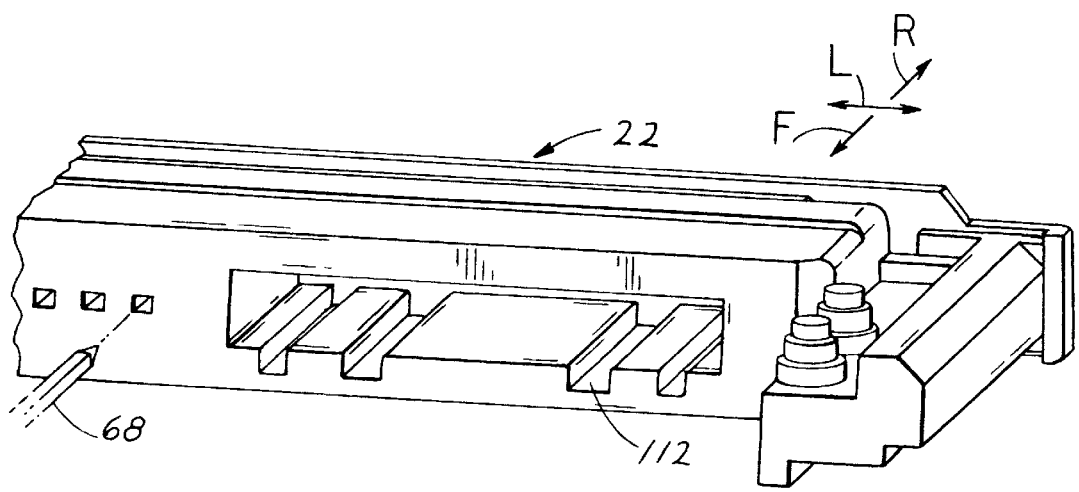
FIG. 5 is a partial rear isometric view of the end cap of the PC card of FIG. 4.

FIG. 4 illustrates the adaptor 50 in its extended position, with the plug 42 received in the receptacle 80. Applicant prefers to form each end or leg 82 of the hold-down with a rearwardly-extending loop 120 to accurately position the laterally opposite sides 122 of the plug. The loop also provides resilience in vertical movement of the hold-down middle 84. The plug 42 includes a housing in the form of a block or block portion 130 of largely parallepiped shape. In the illustrated design, the height A (FIG. 2) of the rear end cap is about 4.9 mm, the maximum height B of the slot 102 is about 2.7 mm, while the width C of the slot is about 14 mm. The block portion 130 (FIG. 4) has a height E at its front end 132 of about 8 mm, with the height increasing along a retention clip 134. The retention clip has a thin front portion 136 which is largely horizontal, and has a rear handle portion 138 that is of increased thickness.

Applicant prefers to engage the clip front portion 136 and press down thereat to hold the plug terminals engaged with the adaptor contacts, because the height at 136 (about 8 mm) is not as great as at the rear handle portion 138. This reduces the required height of the hold-down 54 in its deployed position and the required longitudinal length of the hold-down in its stowed position. It also is possible to form the hold-down so it engages only the upper surfaces 140 at the opposite sides of the block portion 130, with the step surfaces 140 lying only about 7 mm above the bottom of the block portion. The step surfaces 140 lie about 1 mm below the top 141 of the block at its front portion from which the thickened part 139 (FIG. 8) of the retention clip 134 extends.

Figure 6:
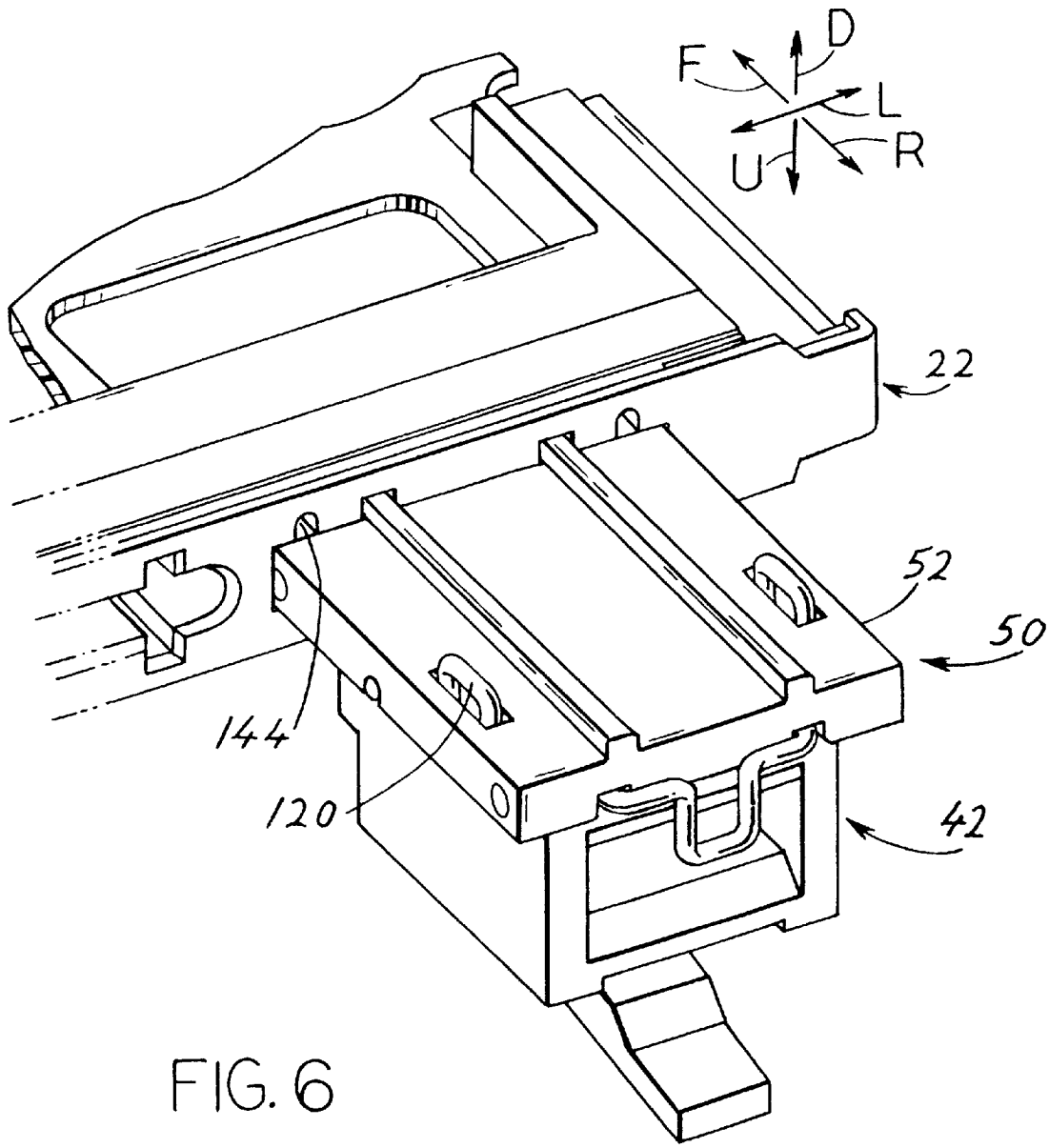
FIG. 6 is an isometric view of a portion of the PC card of FIG. 1, but upside-down from the orientation of FIG. 1, with the platform in its extended position and the plug positioned on the platform, but with the hold-down shown in its stowed position.

It may be noted that the circuit board 20 has a recess 142 for receiving the platform in its stored position. In many cases it is desired to place as much circuitry (e.g. memory chips) on the circuit board of a PC card, so it is desirable that the circuit board cutout 142 be as short as possible in the longitudinal direction M. FIG. 6 shows that the end cap 22 has grooves 144 for receiving the loops 120 of the bail.

Figure 8:
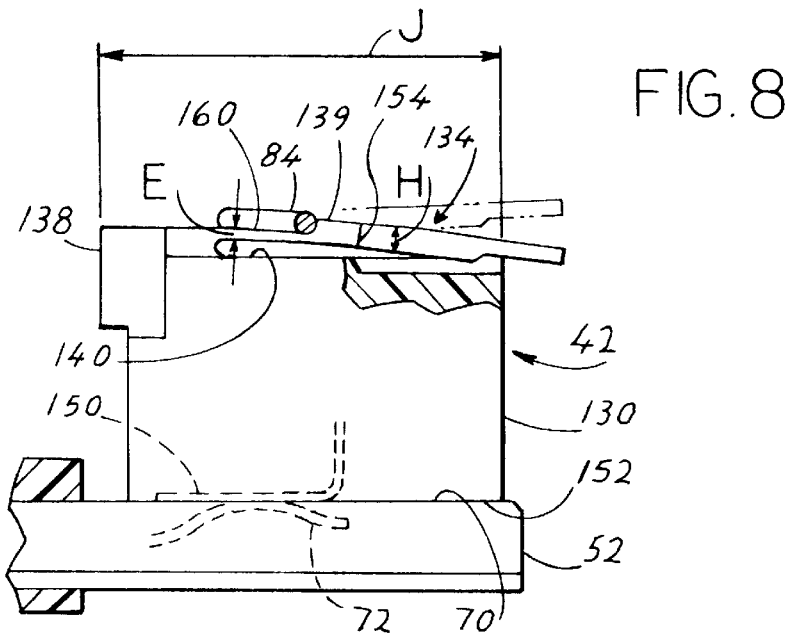
FIG. 8 is a side elevation view showing the plug lying on the extended platform, and with the hold-down deployed, showing a sectional view of the hold-down.

FIG. 8 illustrates the plug 42 with plug terminals 150 engaging the adaptor contacts 72 and with a bottom 152 of the plug block portion 130 resting against the platform upper surface 70. Contact force between the plug terminals 150 and adaptor contacts 72 urges the plug upwardly, but the middle portion or middle 84 of the hold-down presses down the block portion 130 and therefore the terminals 150. The plug 42 can be removed when a considerable force such as more than one kilogram is applied in a rearward direction R to the block portion 130 as through the cable 44. This has the advantage that if the cable is accidentally tugged, this will not damage the adaptor 50 or the PC card, but instead the plug will merely pull out. A pull force on the order of magnitude of one kilogram to pull out the plug 42, occurs because the holder 52 slightly downwardly depresses the front end part 160 of the retention clip 134 and the handle 100 presses down against the block. The plug can be removed with less rearward force by pulling up on the handle 100. Some resilience in such pullup is obtained from the loops 120 (FIG. 4) in the ends or legs 82 of the holdown. Also, the handle 100 presses downwardly on the plug.

Figure 7:
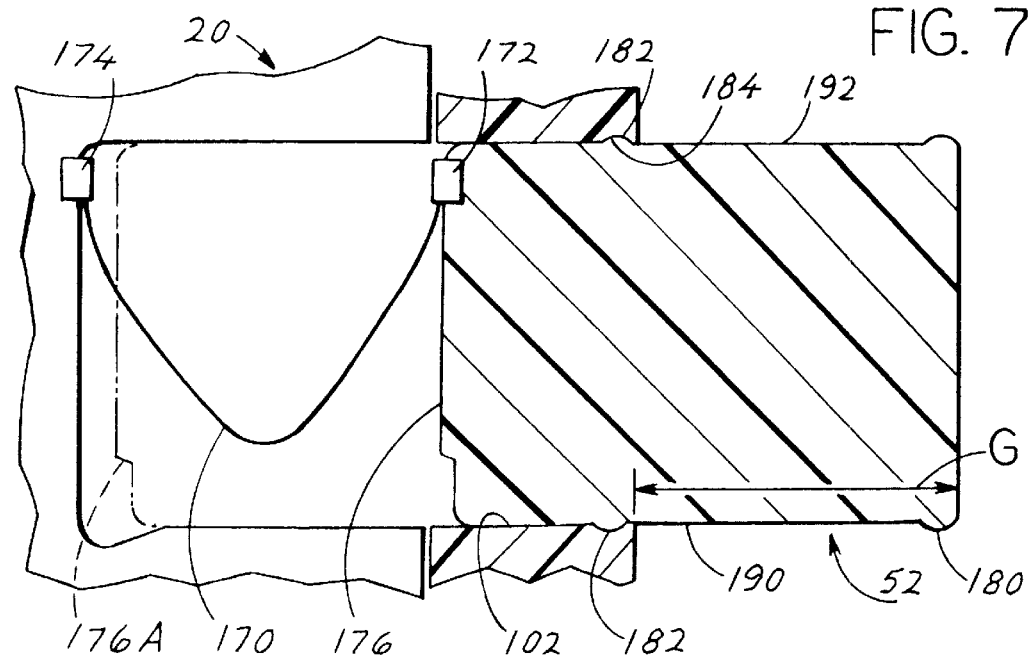
FIG. 7 is a partial plan and sectional view of the PC card of FIG. 1, showing the platform in its extended position.

FIG. 7 shows that a flexible cable 170 is used to connect terminations 172, 174 on the platform 52 and on the PC board 20 while the platform 52 is able to slide between the positions wherein its rear end is at 176 and 176A. The platform has rearward and forward bumps 180, 182 at its opposite sides, which can enter recess retainers 184 formed in the rear end cap 22. This retains the platform in its extended position and in its stored position, with a force of about 0.2 kilograms required to move the platform. The opposite sides 190, 192 of the platform are not very closely received within the slot 102 in the rear end cap, since applicant relies upon the rails 110 (FIG. 2) for accurately laterally locating the platform. The height of the platform is only slightly less than the height of the slot, to vertically position the platform. In the extended position of FIG. 7, the rear portion of the platform lies within a longitudinal length G that is rearward of the rear end cap, which is at least twice the vertical height B of the platform.

Figure 9:
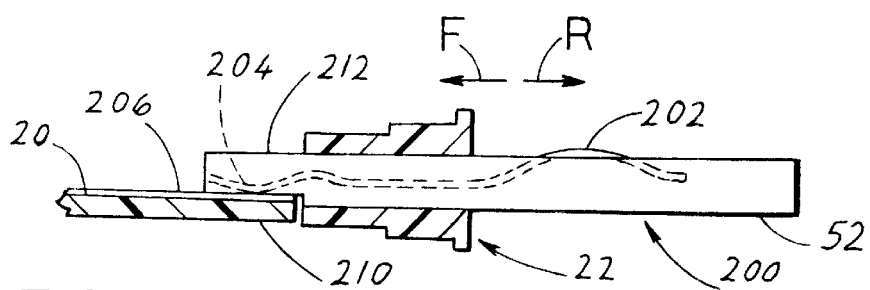
FIG. 9 is a partially sectional side view of an adaptor and circuit board of another embodiment of the invention.

FIG. 9 illustrates another adaptor 200, wherein electrical connection between the slidable platform 52 and an electrical coupling on the circuit board 20 is achieved by constructing the adaptor contacts 202 with tails 204 that are resiliently biased downwardly against traces 206 lying on the circuit board. When the adaptor 202 lies in its forward or stored position, it generally does not matter whether or not the tails 204 engage the traces. However, when the adaptor is in its extended position, the tails engage the traces 206 to establish contact therewith. This arrangement requires that a rear portion 210 of the circuit board or a board connected therewith, lie below or above the rear end 212 of the platform.

Figure 10:
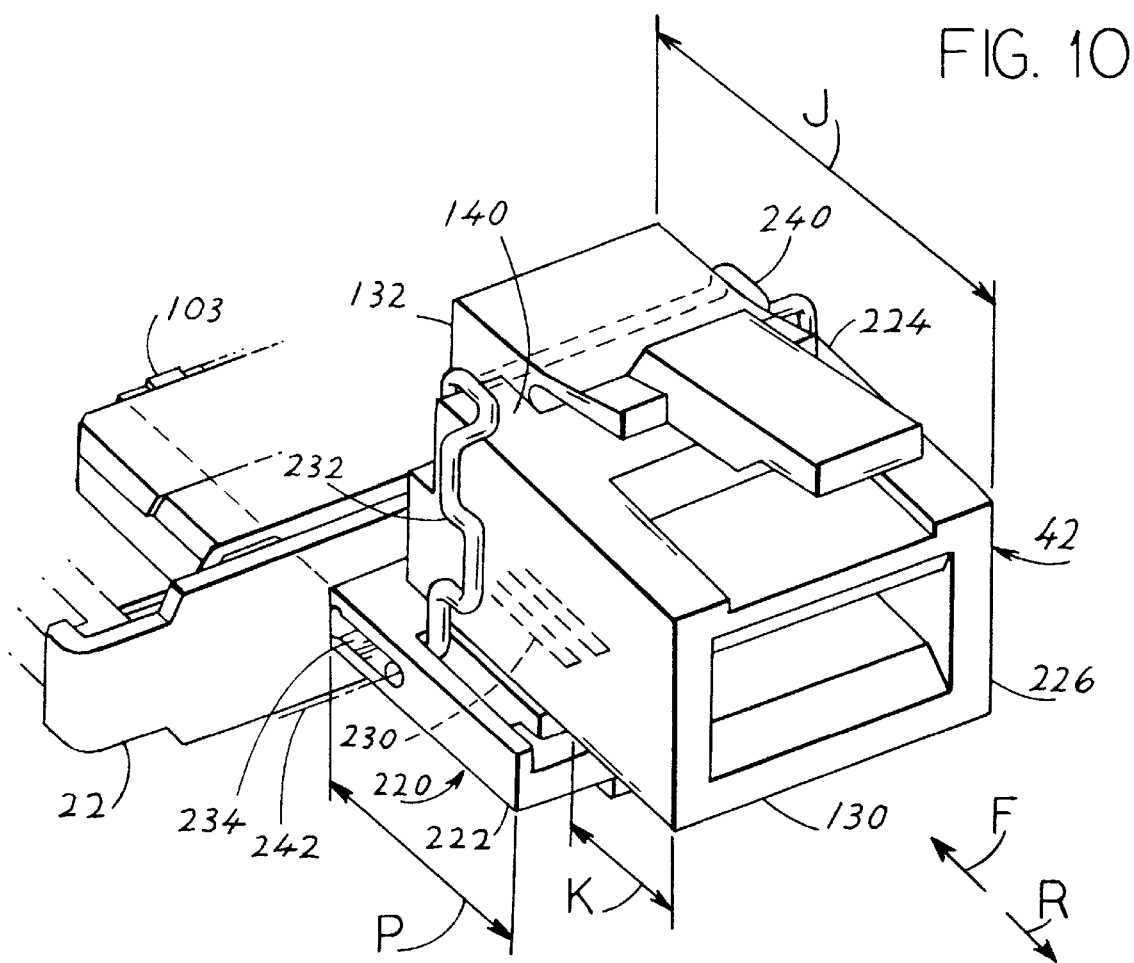
FIG. 10 is an isometric view of a portion of an adaptor and rear end cap of another embodiment of the invention.

FIG. 10 illustrates another adaptor 220 with a platform 222 that extends only a short distance rearward of the rear end cap 22, to support only the front portion 224 of the plug 42. The rear portion 226 of the plug is unsupported by the platform. Preferably, the unsupported portion has a length K of a plurality of millimeters so the platform 222 projects rearwardly of the end cap by a plurality of millimeters less than is required in the embodiments of FIGS. 1–9. For example, a common RJ plug 42 has a length J of about 13 mm in a longitudinal direction. However, the terminals 230 extend a distance rearward of the front end 132 of the plug, of only about 5 mm. Applicant can support perhaps half of the length J of the plug block portion and still provide a stable connection. The platform 222 extends rearward of the end cap 22, preferably by no more than 10 mm, with the particular platform 222 extending a distance P of about 8 mm to leave an overhang K of about 5 mm for a plug block portion 130 of 13 mm length.

FIG. 10 shows a hold-down 232 which has locations 240 that press down against the step upper surfaces 140 that lie on opposite sides of the plug. The hold-down can be pivoted down about axis 242 and then slid forwardly along platform track slots 234. The platform track slots are narrowed except at their front and rear ends, so the lower ends of the wire hold-down snap into each end and remain thereat until forcibly removed.

While adaptors are shown which slide only longitudinally, it is also possible to provide adaptors that pivot between stored and extended positions, although applicant prefers the sliding arrangements illustrated.

Although terms such as "top", "bottom", etc. have been used to describe the invention as illustrated, it should be understood that the PC card and adaptor can be used in any orientation with respect to the Earth.

Thus, the invention provides a PC card and apparatus for incorporation in the rear portion of a PC card, to hold and connect to a plug, especially one of the RJ or telephone-type. The apparatus and PC card include a molded rear end cap at the rear of the PC card, with the cap having a slot. An adaptor includes a platform that is moveably mounted within the end cap slot between stored and extended positions, with the adaptor including a hold-down that holds down a plug to an upper surface of the platform in the extended position. The end cap has slot walls that receive the adaptor platform, with the slot walls extending 360° around the slot, without a break, to provide rugged support for the platform in its extended position. Although this results in a platform having a height at least 1 mm less than the height of the rear end cap, it results in rugged holding of the platform. The hold-down is mounted on the platform to move between a deployed position wherein it extends high above the platform to lie over a portion of the plug, and a stowed position wherein it lies within the confines of the platform as viewed along its longitudinal axis. In the stowed position, the middle of the holdown is accessible from the rear end of the PC card to enable a person to grasp it to pullout the platform. The hold-down is preferably in the form of a wire with opposite ends or legs having loops to stabilize the position of the plug and with a top bent into a loop to form a handle that extends upwardly immediately behind the rear end cap in the stored position of the adaptor.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A PC card with a rear portion for connection to a telephone or RJ type plug, wherein the PC card is constructed to fit into a slot of an electronic device so contacts of a front electrical connector of the PC card can connect to circuitry in the electronic device, wherein:

said PC card includes a support structure having laterally-spaced sides and longitudinally-spaced front and rear end portions;

an adaptor which has an adaptor rear portion with a plurality of adaptor contacts for engaging terminals of an RJ type connector, wherein said adaptor is moveable between a stored position wherein said adaptor rear portion lies primarily within said support structure and an extended position wherein said adaptor rear portion lies primarily outside and rearward of said support structure;

an electrical coupling that couples said adaptor contacts to said contacts of said front connector;

said support structure rear end portion includes a plastic molded rear end cap that has a height of at least 90% of the height of said card rear portion and that has a width dimension in a lateral direction, with said rear support structure having a slot within which said adaptor moves between its withdrawn and extended positions, with said adaptor being closely slidably guided in sliding in forward and rearward directions solely by slot walls of said end cap;

said slot is smaller in width and in height than the width and height of said end cap, and said end cap has slot walls that extend 360° around said slot, to thereby ruggedly support said adaptor in said extended position.

2. The PC card described in claim 1 wherein:

said adaptor includes a molded plastic platform having a horizontal platform surface, and said adaptor contacts project above said platform surface;

said adaptor includes a hold-down that is pivotally mounted on said platform to move between stowed and deployed positions wherein said hold-down lies respectively substantially within and above said platform, with said hold-down and platform forming a receptacle that receives and retains said plug in said deployed position of said hold-down;

said hold-down has a handle part, and in said stowed position of said hold-down said handle part projects rearward of said end cap to provide a handle for movement of said adaptor from said stored position to said extended position.

3. The PC card described in claim 1 wherein:

said adaptor includes a molded plastic platform having a platform surface, and said adaptor contacts project beyond said platform surface;

said adaptor includes a bail that is pivotally mounted on said platform to pivot between stowed and deployed positions wherein said bail lies respectively substantially within and vertically beyond a rearward extension of said support structure, with said bail and platform forming a receptacle that receives and retains said plug in said deployed portion of said bail;

said plug includes a block portion and a retention clip which has a front end part of a first thickness extending generally rearwardly from said block, and a middle part of a second thickness that is greater than said first thickness extending rearwardly from said front end part;

said bail has a middle portion with plug hold-down parts that are positioned to press down against said front end part of said retention clip.

4. The PC card described in claim 1 including:

a circuit board mounted on said support structure and having a rear portion with a circuit board face that has a plurality of traces;

said adaptor contacts have rear ends which are biased against said traces to engage them, when said adaptor lies in said deployed position.

5. The PC card described in claim 1 including said RJ type plug, wherein:

said plug includes a block of insulative material having a predetermined longitudinal length and said adaptor includes a platform which has a longitudinal length which is no more than 10 mm and which is a plurality of millimeters less than the length of said block, to leave an overhang of a plurality of millimeters along which the rear of said block rearwardly overhangs said platform.

6. The PC card described in claim 1 including said RJ type plug, wherein:

said plug includes a block of insulative material with a front portion having bottom and having a top lying a predetermined distance above said bottom, and a retention clip which extends at a rearward-upward incline from said top of said front portion, and said block has opposite sides with steps having step upper surfaces that each lie below the height of said top;

said adaptor includes a platform having a platform surface;

said adaptor includes a bail that is pivotally mounted on said platform to pivot between stowed and deployed positions wherein said bail lies respectively substantially within and vertically above said platform with said bail and platform forming a receptacle that receives said plug in said deployed portion of said bail;

said bail has a middle portion with plug hold-down parts that are positioned to press down against said step upper surfaces of said block.

7. A PC card for connecting to a telephone-type plug that is taller than the PC card, comprising:

a support structure having a longitudinal rear end portion forming a molded rear end cap with slot walls forming a longitudinal through slot therein of predetermined average height;

an adaptor which includes a platform that is longitudinally slidable in said slot between a rearward extended position and a forward stored position, with said slot having slot walls that closely slidably guide said platform in longitudinal sliding, and a hold-down member for holding the plug to the platform when the platform lies in said extended position;

said slot walls of said rear end cap extend longitudinally by at least twice said slot average height and surround said slot by 360° as viewed in a forward direction, to thereby ruggedly support the platform.

8. The PC card described in claim 7 wherein:

said hold-down member includes a wire bail that has opposite sides pivotally mounted on said platform and about a primarily lateral axis and a middle portion, with said bail being pivotable between a deployed position wherein said middle lies high over said platform to lie over a portion of said plug, and a stowed position wherein said bail extends primarily rearward from said axis, with said middle forming a handle that can be grasped to pull out said platform from its stored position.

9. Apparatus for incorporation in a PC card to hold and connect to a plug, comprising:

a molded rear end cap for mounting at the rear of the PC card, said end cap having a cap rear end surface and having a slot extending forwardly into said cap rear end surface;

a platform with front and rear end portions, that is moveably mounted on said end cap between a stored position wherein substantially all of said platform lies forward of said cap rear end surface and an extended position wherein said platform extends a plurality of millimeters rearward of said cap rear end surface;

a hold-down on said platform for holding down said plug against said platform when said platform lies in said extended position and said hold-down lies in a deployed position, said hold-down being moveable to a stowed position wherein said hold-down lies primarily within said platform and forms handle means for pulling said platform largely rearwardly from said stored position toward said extended position.

10. The apparatus described in claim 9 wherein:

said hold-down comprises a wire bail with opposite sides and a middle, wherein each of said opposite sides includes a loop portion that enables resilient increase in the side height.

11. Apparatus for incorporation in a PC card to hold and connect to an RJ plug that includes a block portion of at least 11 mm length in a longitudinal direction, comprising:

a molded rear end cap for mounting at the longitudinal rear of the PC card, said end cap having a cap rear end surface and having a slot extending forwardly into said cap rear end surface;

a platform with front and rear end portions, that is moveably mounted on said end cap between a stored position wherein substantially all of said platform lies forward of said cap rear end surface and an extended position wherein said platform extends a plurality of millimeters rearward of said cap rear end surface;

a hold-down mounted on said platform for holding down said plug against said platform when said platform lies in said extended position;

in said extended position of said platform, said platform extends no more than 10 mm rearward of said cap rear end surface, so said block portion overhangs said platform by extending rearward of said platform.

12. A PC card with a rear portion for connection to a telephone or RJ type plug, wherein the PC card is constructed to fit into a slot of an electronic device so contacts of a front electrical connector of the PC card can connect to circuitry in the electronic device, wherein:

said PC card includes a support structure having laterally-spaced sides and longitudinally-spaced front and rear end portions;

an adaptor which has an adaptor rear portion with a plurality of adaptor contacts for engaging terminals of an RJ type connector, wherein said adaptor is moveable between a stored position wherein said adaptor rear portion lies primarily within said support structure and an extended position wherein said adaptor rear portion lies primarily outside and rearward of said support structure;

an electrical coupling that couples said adaptor contacts to said contacts of said front connector;

said support structure rear end portion includes a plastic molded rear end cap that has a height of at least 90% of the height of said card rear portion and that has a width dimension in a lateral direction, with said rear support structure having a slot within which said adaptor moves between its withdrawn and extended positions;

said slot is smaller in width and in height than the width and height of said end cap, and said end cap has slot walls that extend 360° around said slot, to thereby ruggedly support said support structure in said extended position;

said adaptor includes a platform, and said rear end cap and said platform end have parts with retainers that retain said platform in said stored position and in said extended position while allowing said platform to be forcefully moved, with one of said parts forming a recess and the other forming a bump that fits into the recess.

13. A PC card with a rear portion for connection to a telephone or RJ type plug, wherein the PC card is constructed to fit into a slot of an electronic device so contacts of a front electrical connector of the PC card can connect to circuitry in the electronic device, wherein:

said PC card includes a support structure having laterally-spaced sides and longitudinally-spaced front and rear end portions;

an adaptor which has an adaptor rear portion with a plurality of adaptor contacts for engaging terminals of an RJ type connector, wherein said adaptor is moveable between a stored position wherein said adaptor rear portion lies primarily within said support structure and an extended position wherein said adaptor rear portion lies primarily outside and rearward of said support structure;

an electrical coupling that couples said adaptor contacts to said contacts of said front connector;

said support structure rear end portion includes a plastic molded rear end cap that has a height of at least 90% of the height of said card rear portion and that has a width dimension in a lateral direction, with said rear support structure having a slot within which said adaptor moves between its withdrawn and extended positions;

said slot is smaller in width and in height than the width and height of said end cap, and said end cap has slot walls that extend 360° around said slot, to thereby ruggedly support said support structure in said extended position;

said adaptor includes a hold-down in the form of a wire with opposite bail sides and a largely horizontal middle;

each of said bail sides is bent into a loop.

14. A PC card with a rear portion for connection to a telephone or RJ type plug, wherein the PC card is constructed to fit into a slot of an electronic device so contacts of a front electrical connector of the PC card can connect to circuitry in the electronic device, wherein:

said PC card includes a support structure having laterally-spaced sides and longitudinally-spaced front and rear end portions;

an adaptor which has an adaptor rear portion with a plurality of adaptor contacts for engaging terminals of an RJ type connector, wherein said adaptor is moveable between a stored position wherein said adaptor rear portion lies primarily within said support structure and an extended position wherein said adaptor rear portion lies primarily outside and rearward of said support structure;

an electrical coupling that couples said adaptor contacts to said contacts of said front connector;

said support structure rear end portion includes a plastic molded rear end cap that has a height of at least 90% of the height of said card rear portion and that has a width dimension in a lateral direction, with said rear support structure having a slot within which said adaptor moves between its withdrawn and extended positions;

said slot is smaller in width and in height than the width and height of said end cap, and said end cap has slot walls that extend 360° around said slot, to thereby ruggedly support said support structure in said extended position;

said adaptor includes a hold-down in the form of a wire with largely vertical opposite bail sides and a largely horizontal middle in the deployed position of said bail;

said horizontal middle includes a part extending in a loop that lies in a horizontal plane in said deployed position of said bail.

15. Apparatus for incorporation in a PC card to hold and connect to an RJ plug that includes a block portion, comprising:

a molded rear end cap for mounting at the longitudinal rear of the PC card, said end cap having a cap rear end surface and having a slot extending forwardly into said cap rear end surface;

a platform with front and rear end portions, that is moveably mounted on said end cap between a stored position wherein substantially all of said platform lies forward of said cap rear end surface and an extended position wherein said platform extends a plurality of millimeters rearward of said cap rear end surface;

a hold-down mounted on said platform for holding down said plug against said platform when said platform lies in said extended position;

said hold-down has a pair of legs with lower ends;

said platform has a pair of track slots extending primarily in forward and rear directions and having slot rear ends, and each of said leg lower ends is pivotable about a longitudinal axis in one of said slot rear ends and is slidable in forward and rearward directions along said track slots.

* * * * *